United States Patent [19]

Moyer

[11] Patent Number: 4,546,313
[45] Date of Patent: Oct. 8, 1985

[54] PEAK POWER RATIO GENERATOR

[75] Inventor: Robert D. Moyer, Albuquerque, N. Mex.

[73] Assignee: The United States of America as represented by the United States Department of Energy, Washington, D.C.

[21] Appl. No.: 474,997

[22] Filed: Mar. 14, 1983

[51] Int. Cl.[4] .................... G01R 19/16; G01R 21/04
[52] U.S. Cl. ................... 324/103 P; 307/358; 324/95
[58] Field of Search .......... 324/103 P, 102, 158 MG, 324/95; 307/358, 351

[56] References Cited

U.S. PATENT DOCUMENTS

| 2,880,392 | 3/1959 | Paulsen | 324/99 D |
|---|---|---|---|
| 2,946,013 | 7/1960 | Deighton | 324/111 |
| 2,952,768 | 9/1960 | Caler et al. | |
| 3,159,787 | 12/1964 | Sexton et al. | 324/99 D |
| 3,659,101 | 4/1972 | Friedman | |
| 3,835,837 | 9/1974 | Peek | |
| 3,924,078 | 12/1975 | Bussey | 324/99 D |
| 4,038,568 | 7/1977 | May et al. | 324/103 P |
| 4,086,531 | 4/1978 | Bernier | 324/158 MG |
| 4,103,108 | 7/1978 | Munter | 324/76 A |
| 4,162,444 | 7/1979 | Rodgers | 324/103 P |

OTHER PUBLICATIONS

Information Sheet on Hewlett-Packard 8900B and 8477A Power & Noise Figure Meters.
Information Sheet on Narda Model 66A34 Peak Power Meter; Narda Microwave Corp., Plainview, N.Y.
Information Sheet on PRD 6690-A Power Meter; PRD Electronics, Inc., Westbury, N.Y.
Information Sheets on Pacific Measurements Model 1018B; Pacific Measurements, Inc., Palo Alto, Calif.; 1977.
Hudson, P. A.; "Measurement of RF . . . ", Proc. of the IEEE; vol. 55; No. 6; Jun. 1967; pp. 851-855.
NBS Technical Note 682; "Implementation of the Notch . . . "; Simpson et al.; NBS, Boulder, Colo.; Jul. 1976.
Operative Information 436A Power Meter; Hewlett-Packard Co.; Apr. 1977; pp. 1-0 to 1-3.
Second-Half 1978 Report, Primary Standard Laboratory; Sandia Laboratories; p. 3.

Primary Examiner—Ernest F. Karlsen
Attorney, Agent, or Firm—George H. Libman; Albert Sopp; Judson R. Hightower

[57] ABSTRACT

A peak power ratio generator is described for measuring, in combination with a conventional power meter, the peak power level of extremely narrow pulses in the gigahertz radio frequency bands. The present invention in a preferred embodiment utilizes a tunnel diode and a back diode combination in a detector circuit as the only high speed elements. The high speed tunnel diode provides a bistable signal and serves as a memory device of the input pulses for the remaining, slower components. A hybrid digital and analog loop maintains the peak power level of a reference channel at a known amount. Thus, by measuring the average power levels of the reference signal and the source signal, the peak power level of the source signal can be determined.

16 Claims, 5 Drawing Figures

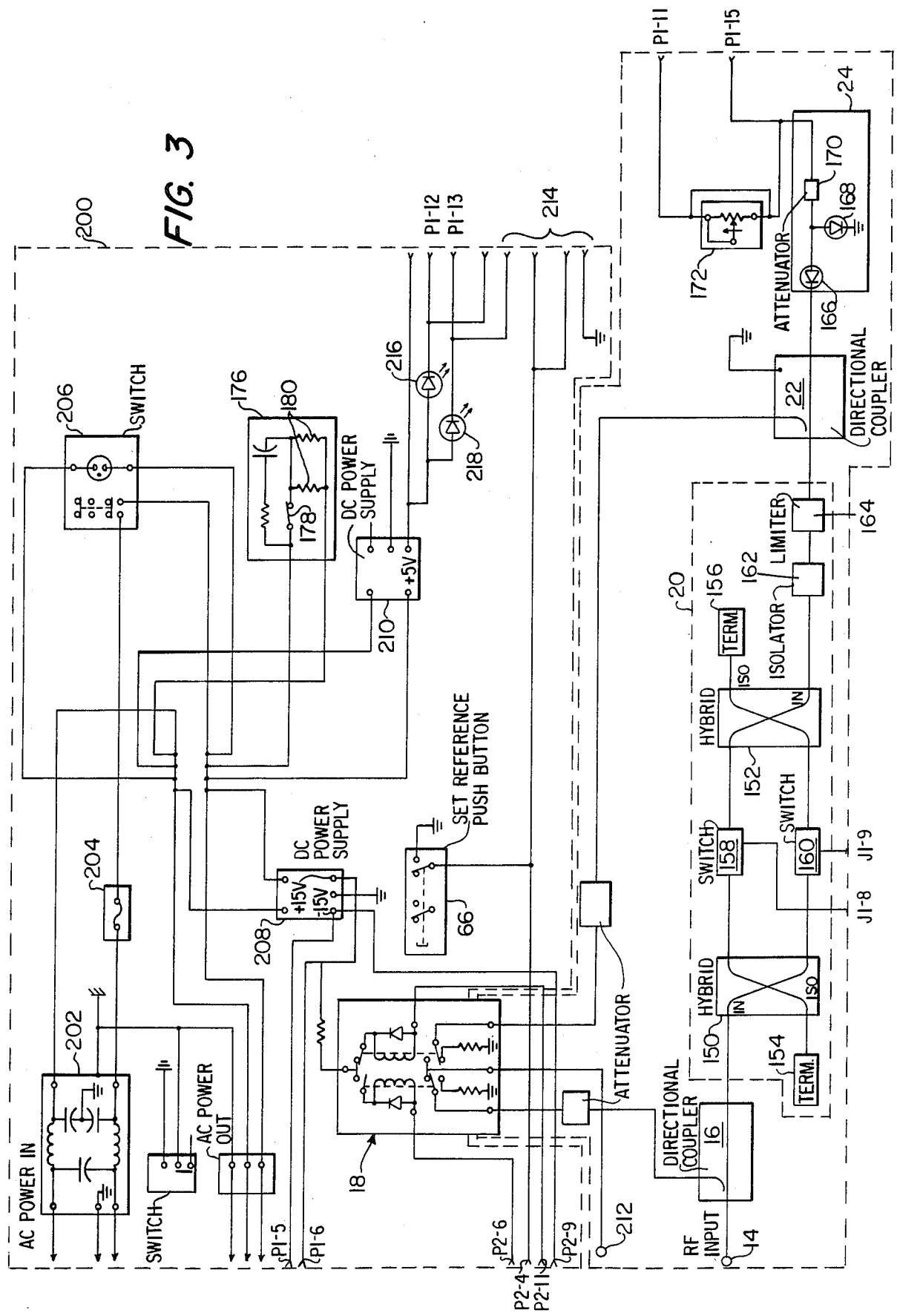

PEAK POWER RATIO GENERATOR

FIELD OF THE INVENTION

The present invention relates to the measurement of the peak power of a pulse train, and in particular, to the measurement of the power of pulse train having pulses with an extremely narrow pulse width and a relatively high pulse repetition frequency.

BACKGROUND OF THE INVENTION

There is presently the need for determining the peak power of pulses in a pulse train in the radio-frequency (rf) range. Pulse trains of this frequency and pulse widths are typically used in radar systems, and the more narrow pulse widths are used in, for example, radar proximity fuses.

The new generation of radar proximity fuses uses pulse widths and pulse repetition frequencies that cannot be measured by any known, commercially available power meter. The meters are used both for product evaluation and product maintenance.

Some peak power detector circuits are disclosed in some prior art patents, such as U.S. Pat. Nos. 2,946,013; 3,659,101; 4,038,568; and 4,162,444. However, each of these circuits suffer from a droop problem that occurs as the result of the use of an analog storage in capacitors of the peak level of the input signals. The droop problem occurs between repetitive input peaks and/or between the time the peak value is stored and the time the value on the storage capacitor is read. Further, each of the circuits disclosed in the patents requires a large subsystem that must operate with rise times smaller than the width of the smallest pulse to be measured. This requires a considerable amount of expensive and extremely critical high speed circuitry. Further, the peak detecting subsystems in each of these circuits must operate over the entire dynamic range of the signals being measured resulting in the final measurements being subject to all of the non-linearities. Finally, it appears that none of the disclosed circuits can accommodate pulse widths below ten nanoseconds or pulse repetition frequencies greater than 20 MHz.

Other problems with some of the circuits in the prior art include their inability to accurately accommodate a pulse envelope that has two or more local peaks. For example, if a double humped waveform is applied to the prior art devices, where the second hump is higher than the first, some prior art circuits will only detect the level of the first hump because of switches that cut off the input signal once an initial peak is sensed. Other prior art circuits, such as the one depicted in U.S. Pat. No. 4,038,568 will detect the second hump of a double humped waveform even if the second hump is smaller than the first.

SUMMARY OF THE INVENTION

The present invention is directed to a method and a circuit for measuring the peak power of a pulse train using a conventional, true-power response power meter. It is an object of the present invention to accurately measure the peak level of a pulsed or modulated signal having a pulse width as short as 7.5 nanoseconds. A further object is the accurate measurement of the peak level of a pulsed or modulated signal whose repetition or modulation frequency is extremely high. This pulse repetition frequency range in one particular embodiment of the present invention extends from a low limit of 1 KHz to approximately 130 MHz. Further, the present invention provides an accurate measurement of the peak power level in pulse trains having a sequence of very short bursts of very high frequency energy, such as that found in the rf or microwave signals.

The present invention accomplishes the foregoing with the detector operating at a constant amplitude level so as to eliminate non-linearity errors while using a minimum number of components that must operate with response times less than the minimum pulse width system capabilities. Further, the present invention utilizes a memory mechanism that is binary in nature and not analog in nature, which eliminates the droop problems inherent in peak sensing circuits utilizing analog storage of voltages with capacitors.

The present invention utilizes commercially available components that are relatively inexpensive. This is insured by utilizing a minimum number of components that must operate at very fast response times.

In a particular embodiment of the present invention, a tunnel diode is utilized to establish a constant peak power level in a reference channel. The constant peak power level is maintained by a closed hybrid digital-/analog loop. A conventional power meter is utilized to measure the ratio of the average power in the reference channel and the average power of the remaining input signal in a signal channel. Calibration of the present invention enables the determination of the peak power level by utilizing the ratio of the average powers.

These and other features and objects of the present invention will be set forth in or obvious from the detailed description of the present invention contained hereinbelow.

BRIEF DESCRIPTION OF THE DRAWINGS

FIG. 3 is a detailed electrical schematic diagram of the remaining part of the invention depicted in FIG. 1.

DETAILED DESCRIPTION OF THE PREFERRED EMBODIMENT

Figure 1:
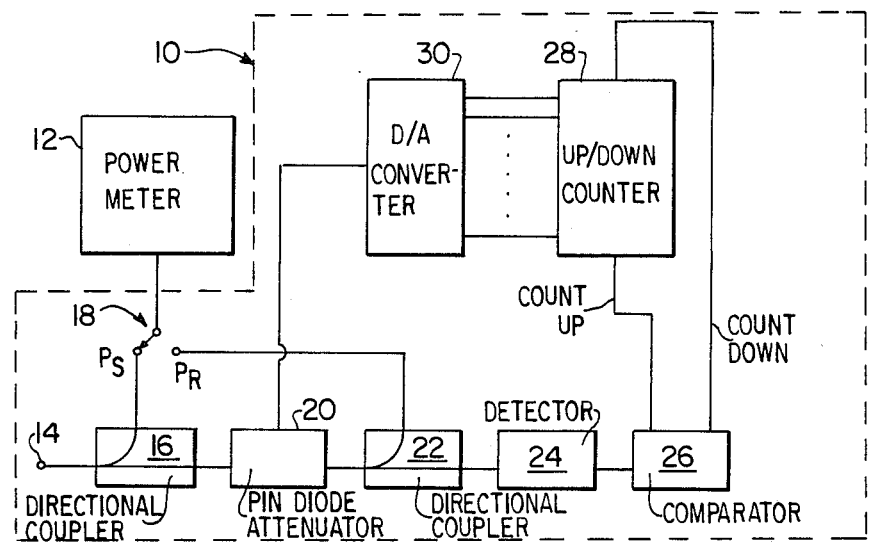
FIG. 1 is an electrical schematic block diagram of a peak power ratio generator according to the present invention.

With reference now to the figures, wherein like numerals indicate like elements throughout the several views, and in particular with reference to FIG. 1, a peak power ratio generator 10 is depicted for use in conjuction with a conventional, ratio measuring, CW, true-power response power meter 12. An exemplary meter that can be used as power meter 12 is a Model 436A Hewlett-Packard power meter with a Model 8481A sensor.

Generator 10 is comprised of conventional commercially available components. As shown in block diagram in FIG. 1, generator 10 receives the desired pulsed signal at input terminal 14. For the purposes of explanation, the pulsed input signal will be assumed to be a radio-frequency signal in the 2.0 to 4.0 GHz range. However, as known by those skilled in the art, such a frequency range is only an exemplary one and any rf signal from 0.1 GHz to 18 GHz can readily be measured. As explained more fully herein, the particular embodiment disclosed is limited to a minimum pulse repetition rate of 10 KHz.

Connected to input terminal 14 is a conventional 10 dB directional coupler 16. Directional coupler 16 divides the input signal into a first component coupled to a coaxial switch 18 and a second component which is coupled to a PIN diode attenuator 20. The first signal component is called the source signal and the second component is called the reference signal. PIN diode attenuator 20 is electrically controlled to maintain a "constant" peak power level at the output thereof. Connected to the output of PIN diode attenuator 20 is a second 10 dB directional coupler 22 which divides the reference signal into a first portion coupled to switch 18 and to a second portion coupled to a detector 24. According to the present embodiment of the present invention, detector 24 is the only component of generator 10 that requires a speed of operation that is faster than the pulse width of the narrowest pulse to be measured. As described in greater detail hereinbelow, detector 24 is a bistable detector which outputs a signal when the input is higher than an inherent internal reference level.

Coupled to detector 24 is a comparator 26 which senses the output of detector 24 and generates either a "count-up" pulse or a "count-down" pulse. The output pulses from comparator 26 are connected to the appropriate, corresponding inputs of a digital up/down counter 28. The digital output of counter 28 is, in turn, connected to a digital-to-analog converter 30. The output of digital-to-analog converter 30 is used to control the operation of PIN diode attenuator 20.

As thus described, generator 10 receives a signal at a directional coupler 16 which provides one signal component to a closed-hybrid (i.e. analog and digital) loop comprised of PIN diode attenuator 20, detector 24, comparator 26, up/down counter 28, and digital-to-analog converter 30. As mentioned above, this loop maintains a "constant" peak power level at the output of attenuator 20 and the input of coupler 22. In actual operation, however, the peak power level ideally oscillates between two very close values, the difference of which depends upon the resolution of digital-to-analog converter 30.

In operation, power meter 12 is connected to the common terminal of switch 18 so that it can receive either the source signal ($P_S$) or the first portion ($P_R$) of the reference signal. Power meter 12 measures the average power of the signals in these two channels and provides the ratio of them. The hybrid loop maintains the peak power level in the reference channel at a predetermined, constant value. Both the peak and average power levels in the source signal channel are directly proportional to the corresponding peak and average power levels in the input signal. The constant of proportionality is set to a convenient value during calibration of generator 10, as explained in greater detail hereinbelow. The peak power level of the reference signal is known and the average power level of that signal can be measured by power meter 12. Since the waveforms in the source signal channel and the reference channel differ only by a scalar constant, the ratio of the average power levels of the signals as read on power meter 12 is equal to the ratio of the peak power levels in the two channels Thus, the unknown peak power level of the source signal can easily be calculated. Generator 10 is adjusted during calibration so that power meter 12 reads the input peak power in dB relative to a 10 milliwatt reference level.

The feedback limit cycle in the hybrid loop operates as follows. Assume that a "high" power level exists at the input of coupler 22. Detector 24 delivers a signal to comparator 26 which is higher than the internal reference level of the comparator. Thus, comparator 26 sends a "count down" pulse to up/down counter 28. The analog equivalent of the output of counter 28 is provided by converter 30 to PIN diode attenuator 20 so as to increase the attenuation thereof so that the power at the input to coupler 22 is decreased to the "low" level. The cycle is then repeated, except that the output of detector 24 is now lower than the reference level and comparator 26 provides a "count up" pulse to counter 28. The resulting output from converter 30 then causes the attenuation of PIN diode attenuator 20 to drop and the power level at the input of coupler 22 is increased to the "high" level. The oscillation between the "high" and "low" levels continues.

The determination of the peak power level of the input signal can be read directly from power meter 12 after it has been properly calibrated. The mathematical basis for this is as follows. The hybrid loop maintains the peak value of the reference signal at the input of directional coupler 22 at a predetermined value, $P_{PR}$. Thus, the average power of the reference signal, $P_R$, is given by:

$$P_R = K_R P_{PR} D \qquad (1)$$

where $K_R$ is a constant describing the loss in the reference channel and D is the duty factor of the unknown input signal.

Similarly, the power of the source signal is given by the formula:

$$P_S = K_S P_{PI} D \qquad (2)$$

where $K_S$ is a constant describing the loss in the source signal channel, $P_{PI}$ is the peak power level of the input signal, and D is the same duty factor. Thus, the ratio in dB of the two signals $P_S/P_R$, is given by the following formula:

$$10 \log_{10} \frac{P_S}{P_R} = 10 \log_{10} \frac{P_{PI}}{\frac{K_R P_{PR}}{K_S}} \qquad (3)$$

The quantity ($K_R P_{PR}/K_S$) is adjusted during calibration to have a value of precisely 10 milliwatts. Thus, the ratio $P_S/P_R$, expressed in dB provides the peak power level of the input signal in dB relative to a 10 milliwatt reference level. This result is independent of the duty factor, D, because the duty factor is the same for both the source signal channel and reference signal channel.

During the measurement of the peak power level of an input signal, the operator switches switch 18 such that power meter 12 senses the average power of the reference channel. The preferred power meter, described above, has a dBm mode which is selected. This meter also has a measurement switch entitled "dB [REF]". By depressing this button on power meter 12, the internal circuitry of the power meter establishes the average power level, $P_R$, in the reference channel as the 0.0 dB reference for all subsequent readings. Switch 18 is then selected to read the power from the source signal and, as calibrated above, the output of power meter 12 will actually be the peak power level of the input signal expressed in dB relative to 10 milliwatts.

Figure 2:
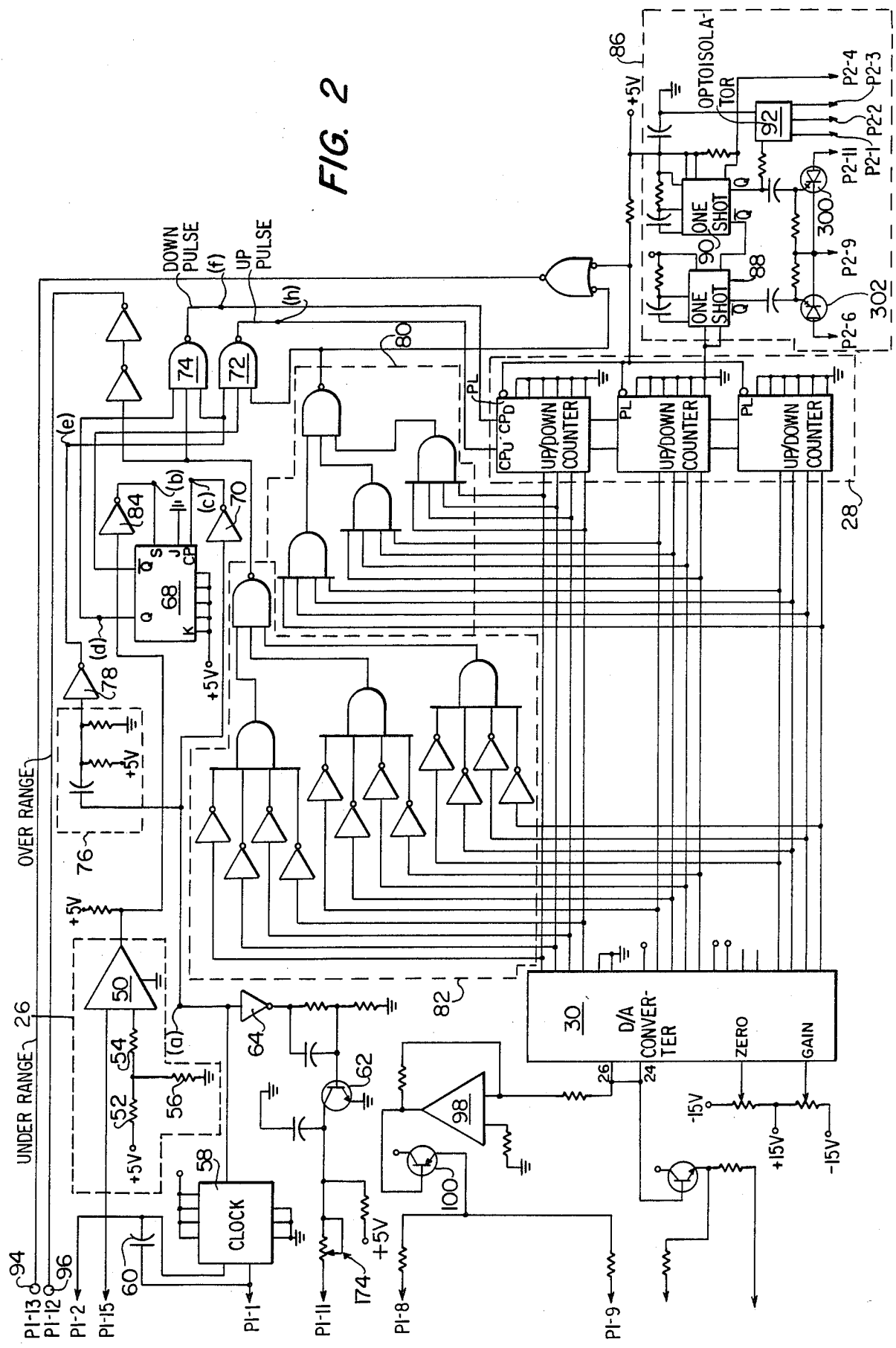
FIG. 2 is a detailed electrical schematic diagram of part of the invention depicted in FIG. 1.

It can be seen that the accuracy of generator 10 is dependent upon the ability of the hybrid loop to maintain the reference signal peak power level, $P_{PR}$, at the input of coupler 22 at a constant level irrespective of the waveform of the unknown signal. A specific embodiment of the circuitry to maintain this constant level is depicted in FIGS. 2 and 3. For convention, the designation of a signal from FIG. 2 going to the circuitry of FIG. 3 is identified by the same Plug pin number in both figures. FIG. 2 depicts the circuitry of comparator 26, counter 28, and converter 30. FIG. 3 depicts the specific embodiment of the circuitry of PIN diode attenuator 20, detector 24, and switch 18. In addition, FIG. 3 depicts the electrical circuitry for generating the necessary power supply voltages and signal control voltages.

Beginning first with FIG. 2, comparator 26 includes an operational amplifier 50 wired as a comparator. The signal from detector 26 is coupled to the positive input of operational amplifier 50 and a voltage divider network is connected to the negative input. Operational amplifier 50 can be an integrated circuit number uA775 and the voltage divider network can be comprised of resistors 52, 54, and 56 connected as a "T" network. Resistors 52 and 54 are connected between a +5 volt power supply and the negative input of operational amplifier 50 and have exemplary values of 1.54 K Ohm and 5.11 K Ohm, respectively. Resistor 56 is connected between ground and resistors 52 and 54 and has an exemplary value of 316 Ohms.

Synchronization is maintained throughout the digital portion of the hybrid loop by a system clock 58. Clock 58 can be a conventional integrated circuit No. 74LS324 whose frequency is determined by a capacitor 60. In order to be able to change the frequency of clock 58, two terminals, P1-1 and P1-2 are provided so that an external capacitor can be connected in parallel with capacitor 60. Capacitor 60 has an exemplary value of 0.068 microfarad. With this value of capacitance, clock 58 will provide an approximate frequency of 3 KHz. With this frequency, the minimum pulse repetition frequency of the input signal is 10 KHz. By increasing the capacitance of capacitor 60 by a factor of 10, an input signal having a minimum lower pulse repetition frequency of 1 KHz can be measured. However, the tradeoff is that the clock runs an equal factor slower, thereby reducing the response time of the hybrid loop to changes in input signal amplitude. The output of clock 58 is shown as waveform (a) in FIG. 5. The inverse of the output of clock 58 is depicted as waveform (c) in FIG. 5.

For reasons to be described hereinbelow, the positive pulse of clock waveform (a) is denoted the Sense or "S" phase, and the negative pulse of the clock is designated the Interrogate or "I" phase.

The output from clock 58 is connected to a switching transistor 62 through an inverter 64, to the clock input (CP) of a J-K flip-flop 68 through an inverter 70, and to the enable inputs of an "Up" NAND gate 72 and a "Down" NAND gate 74 through the series combination of a delay circuit 76 and an inverter 78. A second enable input to NAND gates 72 and 74 is provided by an underrange decoder circuit 80 and an overrange decoder circuit 82, described hereinbelow. The third input to NAND gates 72 and 74 is provided, respectively, by the $\overline{Q}$ and Q outputs from flip-flop 68.

Flip-flop 68 is wired with the "J" input tied to ground and the "K" input tied to +5 volts. Thus, flip-flop 68 will be set when a low pulse is applied to the set input (S). Flip-flop 68 will be reset when a negative-going pulse is applied to the clock input (CP) at the end of the Interrogate clock phase when the signal applied to the set input is high. The output from operational amplifier 50 is applied as a high pulse or a low pulse to an inverter 84 to the set input (S) of flip-flop 68. Thus, flip-flop 68 will be set if the output from operational amplifier 50 is a high signal, and will be reset on the trailing end of the Interrogate clock phase if the output from operational amplifier 50 is a low signal.

The output from "Up" and "Down" NAND gates 72 and 74 are respectively applied to the "Up" and "Down" inputs of up-down counter 28. In the present embodiment, up-down counter 28 is comprised of three concatenated integrated circuit counters 74LS193. The components of up-down counter 28 are wired to count up and count down when pulses are received on the corresponding count up ($CP_U$) and count down ($CP_D$) inputs. The parallel outputs from counter 28 are connected to the inputs of digital-to-analog converter 30.

A switch control circuit 86 (FIG. 2) incorporating two monostable multivibrators or oneshots 88 and 90 (which can be integrated circuits No. 74LS221) and an optoisolator 92 control the switching of switch 18 and the operating mode of power meter 12 as described in detail hereinbelow. Upon receipt of a negative-going signal from SET REFERENCE pushbutton 66 (FIG. 3) through terminal P2-4, oneshot 90 is triggered into its unstable state. The resulting positive-going voltage at the Q output of oneshot 90 triggers SCR transistor 300 which drives switch 18 to connect power meter 12 to the reference channel of generator 10. At the same time, the high voltage level on output Q of oneshot 90 drives optoisolator 92 which connects terminals P2-1 and P2-2 together by a saturated transistor. These terminals drive the remote dB(REF) control in power meter 12. Therefore, the power from the reference channel is established as the 0 dB reference level in power meter 12. After allowing approximately 10 seconds for this operation, oneshot 90 returns to its stable state. The resulting positive-going signal at output $\overline{Q}$ of oneshot 90 triggers oneshot 88 into its unstable state. After approximately 4 seconds, oneshot 88 returns to its stable state and the attendant positive-going signal at its $\overline{Q}$ output triggers SCR transistor 302 which drives switch 18 to connect power meter 12 to the source signal from directional coupler 16. The 4 second delay between the loss of drive to optoisolator 92 and the disconnection of power meter 12 from the reference channel is required for proper operation of power meter 12. Use of optoisolator 92 avoids another connection of the circuit grounds of generator 10 and power meter 12. This precludes the possibility of ground loop currents which have degrading effects on the operation of the tunnel diode in detector 24.

In the event that the input signal amplitude is outside of the operating range of the generator 10, the count from counter 28 will either be all one's or all zero's. This condition will be detected by decoders 80 and 82, respectively. The output of these decoders, as mentioned above, will disable NAND gates 72 and 74 and will also produce an underrange or overrange, respectively, condition that can be sensed at terminals 94 and 96, respectively. The overrange decoder circuit 82 working with "Down" NAND gate 74 prevents a disaster when an overrange signal is applied to the input of generator 10. Without this feature, PIN diode attenuator 20 would be driven from maximum attenuation to minimum attenuation while the hybrid was trying to accommodate the excessively high input signal. Similarly, underrange decoder circuit 80 and "Up" NAND gate 72 assure that attenuator 20 will rest in its minimum attenuation state when no input is applied to generator 10.

The output from digital-to-analog converter 30 is applied to the inverting input of an operational amplifier 98. Operational amplifier 98 can be, for example, a type uA741. The output of operational amplifier 98 is connected through an emitter follower 100 to PIN diode attenuator 20 (FIGS. 1 and 3).

With reference now to FIG. 3, the remaining components of generator 10 will be described in greater detail with respect to the specific embodiment depicted therein.

PIN diode attenuator 20 is comprised of a quadrature hybrid, PIN switch subassembly that includes hybrids 150 and 152 having 50 ohm terminations 154 and 156, respectively and connected in a back-to-back relationship on either side of two PIN switches 158 and 160. PIN switches 158 and 160 can be, for example, conventional switches No. HP33104A, or other equivalent single pole-single throw, electronically operated switches. PIN switches 158 and 160 are operated, respectively, through operational amplifier 98 and emitter follower 100, and are connected thereto through connections P1-8 and P1-9. Because the PIN switches 158 and 160 are of the reflective type, they must be placed between the hybrids if the switch subassembly is to present matched impedances to directional couplers 16 and 22. The "in" terminal of hybrid 152 is connected through a conventional isolator 162 to a conventional limiter 164. Limiter 164 protects detector 24 from excessive power levels. For example, when no power is applied, the hybrid loop drives the attenuator subassembly 20 to its minimum attenuation level. If, suddenly, there is a high level signal connected to input terminal 14, limiter 164 reflects the excess power back toward the input until the hybrid loop has time to respond. Isolator 162 reduces measurement errors arising from a variable impedance looking back into the hybrid 152. This condition occurs as the level of the input signal changes.

Detector 24 is comprised of a series combination of a back diode 166 and a tunnel diode 168. These are the only two speed critical components in the embodiment of the invention depicted in FIGS. 2 and 3. Back diode 166 has a positive output and can be, for example, Model DOZ218BR-1 manufactured by Aertech Industries. Tunnel diode 168 functions as a threshhold level sensor and can, in a preferred embodiment, be made from germanium and have an $I_p$ of 10 milliamps. Such a diode provides a good, narrow-pulse response and is commercially available as Model 101050G manufactured by Custom Components, Inc.

Figure 4:
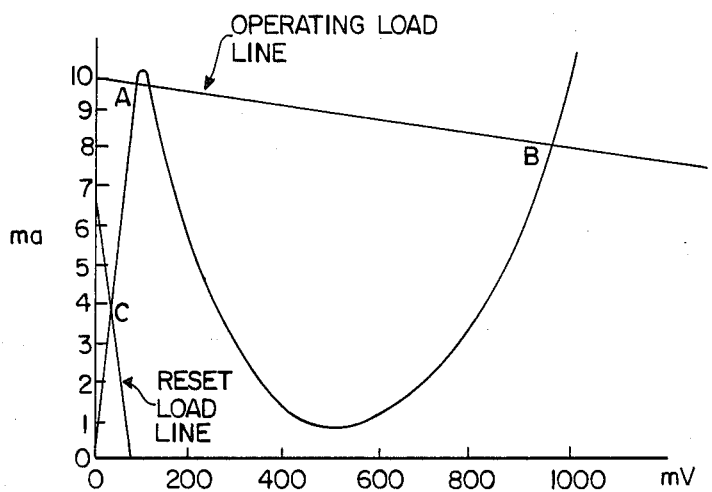
FIG. 4 is a graph of the operating characteristics of a tunnel diode utilized in the present invention as part of the detector circuitry.

With reference to FIG. 4, tunnel diode 168 normally operates on either point A or point B of the curve. A typical tunnel diode is able to switch from point A to point B in less than an nanosecond, and thereafter maintain its operating position at point B providing the indicated output voltage. It is this output voltage that is sensed by operational amplifier 50. Thus, tunnel diode 168 not only provides an extremely fast device, but also one that is bistable thereby providing a memory of a prior occurrence. It is this memory feature that permits the rest of the circuit to operate much slower, by comparison.

The output of tunnel diode 168 is connected to a 10 dB attenuator 170 which, in turn, is connected to operational amplifier 50 and to switching transistor 62 (FIG. 2) via a calibration circuit 172. Attenuator 170 is a broad band attenuator that provides bias to tunnel diode 168 and provides a good broad band termination to the tunnel diode thereby suppressing parasitic oscillations. Calibration circuit 172 is comprised of a knobpot, which permits front panel calibration. A second resistance pot 174 (FIG. 2) is in series with the knobpot of calibration circuit 172. Resistor pot 174 is adjusted during PPRG construction to provide the maximum bias required by tunnel diode 168. Increasing the series resistance effectively drops the left end of the operating load line (FIG. 4) and thereby increases $P_{PR}$.

An isothermal platform 176 is used to mount both back diode 166 and tunnel diode 168. A Fenwal thermoswitch 178 maintains the temperature of the tunnel diode mount at approximately 120° F. This reduces the effects of thermal drift in the peak current of tunnel diode 168. Because back diode 166 is also physically mounted on the tunnel diode mount, back diode 166 also operates in a controlled thermal environment. Fenwal switch 178 controls two heaters 180 physically mounted on platform 176.

With reference again to FIG. 3, the electrical and power requirements are shown in the upper half of FIG. 3 in power circuit 200. AC power is provided through a filter 202 and a fuse 204 to a power control switch 206. AC power is then provided to two DC power supplies 208 and 210, which provide plus and minus 15 volts and +5 volt power to the rest of the circuits.

Also depicted in FIG. 3 is switch 18. Preferably, switch 18 is a coaxial switch which permits remote operation to selectively couple directional coupler 16 or directional coupler 22 to power meter 12 through terminal 212, located on the left hand side of FIG. 3. Located on the right hand side of FIG. 3 are a number of terminals denoted 214 which permit remote operation of generator 10. Finally, two LED indicators 216 and 218 are coupled, respectively, to overrange and underrange terminals 96 and 94 (FIG. 2).

The operation of tunnel diode 168 will now be described with respect to FIGS. 2-5. Tunnel diode 168 is biased through pin P1-11 and calibration circuit 172 so that it operates in the bistable mode depicted in FIG. 4. Normally, point A is the operating point. If, however, back diode 166 detects an rf pulse large enough to drive the current through the tunnel diode above its peak current, the operating point quickly switches to point B. While conducting, tunnel diode 168 operates at either point A or point B. Since tunnel diode 168 responds to very short current pulses, and since its peak current is a well defined threshhold level, tunnel diode 168 serves as a level sensor which ultimately establishes the value of $P_{PR}$. Clock 58 is used to force tunnel diode into a reset position shown at point C, FIG. 4, or to permit its operation at either points A or B.

Figure 5:
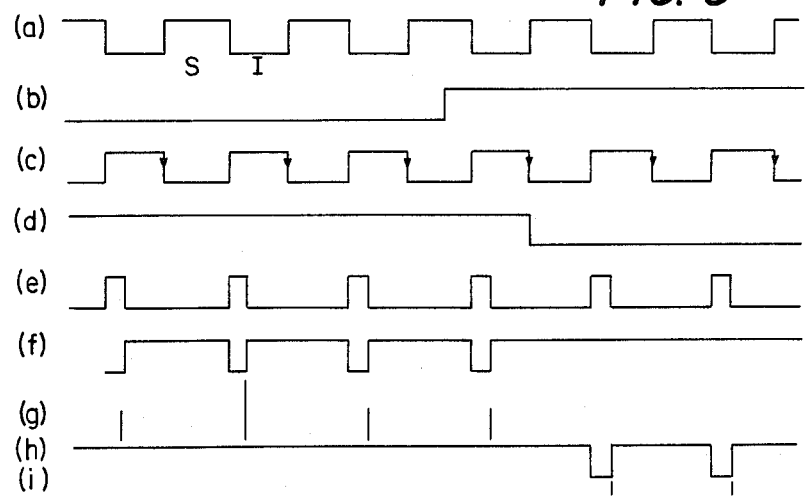
FIG. 5 is a graph of the waveforms at selected points of the circuit depicted in FIG. 2.

During the sense phase of the clock cycle (see waveform (a) in FIG. 5), switching transistor 62 is turned off as a result of the application by inverter 64 of a low voltage signal to its base. This permits tunnel diode 168 to remain biased at point A until it senses an "above threshhold" output from back diode 166. Operational amplifier 50 continually senses the voltage state of tunnel diode 168 and provides its output to inverter 84 which, in turn, drives the "S" input of flip-flop 68.

At the end of the sense clock phase, the clock signal goes low and flip-flop 68 is set if its "S" input was low (i.e., indicating the detection of an above-threshhold pulse during the preceding sense clock phase). When the clock signal goes low, the interrogation clock phase begins and switching transistor 62 is turned on. This, in turn, causes tunnel diode 168 to operate on the reset load line, point C in FIG. 4, thereby resetting it to the low voltage state (point A) during the next sense clock phase. With flip-flop 68 being preset, the Q output has a high level signal which causes a "count down" signal to be delivered to counter 28. Lowering the count of counter 28 by one increases the output from 12-bit digital-to-analog converter 30 by one part in 4096. Operational amplifier 98 inverts this signal and drives emitter follower 100, which in turn drives a slightly larger current through PIN switches 158 and 160 (FIG. 3) via pins P1-8 and P1-9. This slightly increases the attenuation of the attenuator assembly and the limit cycle continues as described above. Conversely, if the set input (S) is high at the beginning of the interrogation clock phase, the inverted clock signal resets flip-flop 68 and causes a "count up" signal to be delivered to counter 28. This results in the opposite effects taking place in the attenuator assembly. Thus, with each clock pulse, there is either an up count or a down count.

As mentioned above, delay circuit 76 was provided to prevent a race condition. This race condition could occur if the attenuation of attenuator 20 was being changed at the same time tunnel diode 168 was being enabled to look at the input signal. However, as shown in detail in FIG. 5, delay circuit 76 prevents this situation by allowing the count of counter 28 to change in the middle of the interrogate phase. This allows the PIN attenuator 20 to settle down before the beginning of the sense phase when tunnel diode 168 is once again enabled to look at the input signal.

The significance of the waveforms shown in FIG. 5 is as follows: Waveform (a) defines the sense (S) and interrogate (I) phases as seen at the output of clock 58. By choice of the resistors in delay circuit 76, inverter 78 is biased such that its input is high under steady-state conditions. However, each negative-going transition in waveform (a) is differentiated by the capacitor in delay circuit 76 such that the input to inverter 78 is driven to the low state for a time period determined by the time constant of delay circuit 76. Consequently, the enable signal supplied to "Up" and "Down" NAND gates 72 and 74, respectively, by inverter 78 is as shown in waveform (e). As a consequence of inverter 70, waveform (c) shows the signal present at the clock (CP) input to flip-flop 68. Flip-flop 68 can change states only on the negative-going edges of waveform (c). If tunnel diode 168 senses input signals higher than its threshhold, the signal at the set input of flip-flop 68 will be low as shown in the left half of waveform (b). Consequently, the Q output of flip-flop 68 will remain high as shown in the left portion of waveform (d). Therefore, "Down" NAND gate 74 drives counter 30 as shown in waveform (f) such that down-counts occur at the instants indicated in waveform (g). Ample time is provided between the down-counts shown in waveform (g) and the onset of the S phase as shown in waveform (a). Similarly, waveform (i) shows the instants when up-counts occur in response to signals from "Up" NAND gate 72 as shown in waveform (h). These signals occur when the set input to flip-flop 68 is high as shown in the right portion of waveform (b). As shown by the transitions in waveforms (b) and (d), each "Up" or "Down" command depicted in waveforms (g) and (i), respectively, is approximately 1 clock cycle behind the situation as shown in waveform (b).

A peak power ratio generator has been described hereinabove which is to be used in conjunction with a ratio measuring power meter to measure the peak power level of an rf pulse train. The present invention permits these measurements on pulse widths that can be as low as 7.5 nanoseconds with pulse repetition frequencies as low as 1 kilohertz. The allowable pulse repetition frequency range is limited on the low end by the requirement that at least one pulse reach tunnel diode 168 during each sense phase, and on the high end, it is bounded by the reciprocal of the pulse width. The duty factor range is limited only by the sensitivity of the power meter and, in the presently preferred power meter, the duty factor is restricted to the 0.01 to 1.0 range. The presently preferred embodiment accurately operates over a frequency range of 2–4 GHz rf frequency at peak power levels ranging from 10 to 4,000 milliwatts. Isolator 162 prevents the circuit in the preferred embodiment from operating in the 4–12 GHz rf frequency band. Operation in other frequency bands can be accomplished by merely choosing rf components which operate in those bands. Such a selection would be obvious to those of ordinary skill in the art. In the aforedescribed presently preferred embodiment, a tunnel diode is used to establish a constant peak power level in a reference channel that is maintained by a closed hybrid digital/analog loop. By calibrating the generator and utilizing the presently preferred power meter, the power meter measures the ratio of the average powers in the reference and signal channels and displays the peak power level of the input signal.

There has now been described a peak power ratio generator and method of measuring the peak power level of an input signal. While the present invention has been described with respect to a presently preferred embodiment, other modifications would be obvious to those of ordinary skill in the art.

I claim:

1. An electrical circuit for generating an output signal representative of the peak power level of an input signal, said circuit comprising:
   means for dividing the input signal into a first reference signal and a second source signal; and
   circuit means for maintaining the peak power level of said reference at a predetermined peak power level, said circuit means including,
   variable attenuator means for controlling the amplitude of said reference signal;
   detector means for detecting when the peak level of the reference signal exceeds a predetermined value; and
   control means, responsive to said detector means, for controlling said variable attenuator means to increase the attenuation of said attenuation means when the peak level exceeds the predetermined value and to decrease the attenuation when the peak level is less than the predetermined value.

2. An electrical circuit as claimed in claim 1 wherein said detector means is the only element of said circuit required to have components having a response time shorter than the minimum pulse width of the input pulses.

3. An electrical circuit as claimed in claim 2 wherein said detector means comprises a back diode which receives said input signal and a tunnel diode connected to the output of said back diode, said tunnel diode having a triggering level equal to said predetermined value.

4. An electrical circuit as claimed in claim 1 wherein detector means comprises a binary signal producing means for producing one signal when said reference signal pulse equals or exceeds said predetermined value and for producing a second signal in all other cases.

5. An electrical circuit as claimed in claim 4 wherein said binary signal producing means comprises a tunnel diode having a triggering level equal to said predetermined value.

6. An electrical circuit as claimed in claim 1 wherein said maintaining circuit means is connected to the output of said dividing means and comprises a digital and analog hybrid loop circuit that includes said detector means.

7. An electrical circuit as claimed in claim 6 wherein said hybrid loop circuit comprises said attenuator means connected to receive the output from said divider means, means for monitoring the output of said detector means and for producing a digital output signal in response thereto, and a digital to analog converter for providing an analog signal corresponding to said digital output signal, said analog signal being coupled to control said attenuator circuit.

8. An electrical circuit as claimed in claim 7 wherein said attenuator means comprises a first and a second two-input, two-output hybrid and PIN diode switch means connected between said outputs of said first and second hybrids, said switch means providing a variable resistance depending upon the magnitude of said analog signal.

9. An electrical circuit as claimed in claim 7 wherein said monitoring means includes comparator means for providing a digital output signal in response to the output from said detector means, and includes a digital storage means for storing a digital value, the output from said digital storage means being coupled to said converter.

10. An electrical circuit as claimed in claim 9 wherein said detector means produces a first binary output signal when the pulse level of an input pulse at least equals said predetermined value and a second binary output signal at all other times; wherein said storage means is an up/down counter having a count-up input and a count-down input; and wherein said comparator means determines which signal is produced by said detector means and in turn produces a corresponding count-up signal or a count-down signal which are respectively coupled to said counter count-up inputs and said counter count-down inputs.

11. An electrical circuit as claimed in claim 10 wherein said hybrid loop circuit further comprises a clock for producing a train of clock signals, each clock signal having a sense pulse portion and an interrogate pulse portion; and wherein said detector means is enabled by said clock sense pulse portion and reset by said clock interrogate pulse portion, and said comparator and counter are activated to provide and to receive, respectively, said count-up signal or said count-down signal only during said clock interrogate pulse portion.

12. An electrical circuit as claimed in claim 11 and further including a delay means for delaying the application of said count-up signal or said count-down signal so as to prevent a race condition between the enabling of said detector means and the control of said attenuator means.

13. An electrical system for measuring the peak power level of an input signal, said system comprising:
means for dividing the input signal into a first signal and a second source signal having a peak amplitude proportional to the peak amplitude of the input signal;
circuit means for adjusting the peak power level of the first signal to a predetermined level independent of the peak power level of the input signal, thereby defining a reference signal; and
means for determining the ratio of the average power levels of said reference and source signals to provide the peak power of the input signal.

14. An electrical system as claimed in claim 13 wherein said maintaining circuit means comprises detector means for detecting when the peak level of a pulse in said reference signal at least equals a predetermined value; and
wherein said detector means comprises a binary signal producing means for producing a binary signal based on whether the reference signal pulse exceeds said predetermined value; and wherein
said maintaining circuit means is a digital and analog hybrid loop circuit that includes a second dividing means for dividing said reference signal into a first component coupled to said determining means and a second component coupled to said detector means.

15. An electrical system as claimed in claim 13 and further including switch means for selectively applying said reference signal and said source signal to said determining means.

16. An electrical system as claimed in claim 13 wherein said determining means comprises a power meter.

* * * * *